(12) United States Patent
Bailey et al.

(10) Patent No.: US 6,326,256 B1
(45) Date of Patent: Dec. 4, 2001

(54) METHOD OF PRODUCING A LASER TRIMMABLE THIN FILM RESISTOR IN AN INTEGRATED CIRCUIT

(75) Inventors: Fred D. Bailey, Irving; Stuart M. Jacobsen, Frisco, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/406,457

(22) Filed: Sep. 27, 1999

Related U.S. Application Data
(60) Provisional application No. 60/112,897, filed on Dec. 18, 1998.

(51) Int. Cl.[7] .............................................. H01L 21/8234
(52) U.S. Cl. .......................... 438/238; 438/329; 438/330; 438/381; 438/382; 438/383; 438/384; 438/385
(58) Field of Search ..................................... 438/238, 329, 438/330, 381–385

(56) References Cited

U.S. PATENT DOCUMENTS

| | | | |
|---|---|---|---|
| 5,081,439 | * 1/1992 | Natzle et al. | 338/195 |
| 5,569,398 | * 10/1996 | Sun et al. | 437/799 |
| 5,685,995 | * 11/1997 | Sun et al. | 437/799 |
| 5,808,272 | * 9/1998 | Sun et al. | 438/799 |

* cited by examiner

Primary Examiner—John F. Niebling
Assistant Examiner—Lynne Gurley
(74) Attorney, Agent, or Firm—Jacqueline J. Garner; W. James Brady III; Frederick J. Telecky, Jr.

(57) ABSTRACT

A thin film resistor processing flow solves the problem of accurately incorporating the resistor (80) to be trimmed in an optimized multilayer stack (60,70). This is achieved by measuring the total thickness of the dielectric stack (60) between the silicon substrate and the top of the dielectric stack just prior to the formation of the thin film resistor (80). Then, the thickness of the dielectric stack (60) is adjusted (60+70) to be an odd integer number of laser quarter wavelengths. The thin film resistor (60) is then formed and overlying dielectric (120) is deposited. The thickness of the overlying dielectric (120) may likewise be adjusted (120+130) to be an odd integer number of laser quarter wavelengths.

6 Claims, 4 Drawing Sheets

METHOD OF PRODUCING A LASER TRIMMABLE THIN FILM RESISTOR IN AN INTEGRATED CIRCUIT

This application claims priority under 35 USC §119(e)(1) of provisional application number 60/112,897 filed Dec. 18, 1998.

FIELD OF THE INVENTION

The invention is generally related to the field of thin film resistors and more specifically to laser trimmable thin film resistors.

BACKGROUND OF THE INVENTION

Thin film resistors are utilized in electronic circuits in many important technological applications. The resistors may be part of an individual device, or may be part of a complex hybrid circuit or integrated circuit. Some specific examples of thin film resistors in integrated circuits are the resistive ladder network in an analog-to-digital converter, and current limiting and load resistors in emitter follower amplifiers. Film resistors can comprise a variety of materials including tantalum nitride (TaN), silicon chromium (SiCr), and nickel chromium (NiCr). These resistor materials are chosen for their resistivity properties and stability, especially with respect to the property of temperature co-efficient of resistance (TCR). Typical values of sheet resistivity and TCR for 10 nm films of thin film resistors are 2000 ohms per square (<200 ppm/° C. TCR) for SiCr and 200 ohms per square (<100 ppm/° C. TCR) for NiCr.

Laser trimmable thin film resistors are well established in the prior art and are an important enabling technology for devices such as analog-to-digital converters with highly monotonic outputs. Laser trimming is necessary in many present day integrated circuits, especially as device tolerance specifications increase. Untrimmed wafers either do not have a high enough yield to allow production of a low cost part or the accuracy of the resistors or other components required in the device is too high to be achieved by process tolerances. The most common approach used today in trimming resistors incorporated in integrated circuits uses functional trimming whereby the circuit is rendered functionally operable, usually at the wafer level using an appropriate probe card. Device parameters such as voltage level are monitored constantly as a laser cuts or removes certain portions of the thin film resistor according to a predetermined trim algorithm. Once a predetermined set of outputs is reached, trimming is stopped.

As well as the above mentioned desired properties of SiCr and NiCr, these materials are also suitable for trimming in completely closed environments, that is, even after they have passivation layers deposited over them and the final steps in processing the wafer containing the devices and resistors have been completed. In this type of laser trimming, the resistor material is not completely physically vaporized, but rather the heat induced by the high intensity laser either partially changes the morphology of the heated part and thus grossly changes its conductivity properties or causes the elements in the resistor to undergo chemical reactions such as oxidation thus also grossly changing the conductivity of the material and creating a highly insulating region. It is important that during this step the laser beam intensity or pulse fluence is uniformly absorbed into the resistor layer at all areas across the wafer. If the absorption into the resistor varies considerably, some resistors in low absorption areas may not be trimmed effectively due to incomplete chemical reaction or morphological change. Other resistors in high absorption areas may absorb too strongly and cause vaporization of the resistor material causing it to remove the overlying passivation layer.

It is well known that the most important factor governing the absorption of the laser into the resistor is the nature of the multilayer dielectric stack in which the resistor is formed. With reference to FIG. 1, a thin film resistor 10 is contained between two stacks of dielectric material 20 and 30. This stack is deposited on a silicon wafer substrate 40. Since the thickness of the dielectric stack films are on the order of the wavelength of the incident laser beam which is highly monochromatic, transmitted and reflected laser beams within the stack can either have a constructive or destructive interference in the area around thin film resistor 10. FIG. 2 shows the reflectivity spectrum for a stack similar to the stack shown in FIG. 1 with the following materials and parameters: a silicon substrate (with refractive index n=3.5, extinction coefficient k=1.7×10$^{-4}$), upon which 10,000 Å of silicon dioxide (n=1.48, k=0) is deposited, followed by 100 Å of NiCr (n=2.63, k=4.28), followed by a final 10,000 Å of silicon dioxide (n=1.48, k=0). According to FIG. 2 the minimum reflectivity points are at 8500 Å and 12000 Å over this wavelength range. These points represent the wavelengths at which the SiCr thin film resistor will absorb most strongly and therefore represent the most suitable laser trimming wavelengths. Additionally, since the derivative of laser absorption is zero at these points, this makes these wavelengths further optimized with respect to repeatability of laser absorption across a wafer. It is noted that any variation in film thickness across the wafer will have the least impact on absorption variations because of the zero differential condition. This is in contrast to points midway between the reflectivity peaks and troughs of FIG. 2, corresponding to the wavelengths where small changes in the thickness of the dielectric layer across the wafer will lead to large and undesirable changes in SiCr absorption.

The thickness of both dielectric stacks 20 and 30 are important in determining the optimum stack parameters. In general, the lower dielectric stack 20 should be an optical quarter wave plate. This means that its physical thickness multiplied by its refractive index should be equal to an odd integer times a quarter of the trimming laser's wavelength. The contribution of the lower layer's importance to the overall cavity increases for thin film resistors that do not absorb the laser substantially. This is almost always the case for resistor materials suitable for trimming like SiCr and NiCr., where the optimum thickness range for trimming has been determined to be between 5 nm and 20 nm.

The upper layer should also be optimized as an anti-reflection coating for the laser wavelength and will similarly be an odd integer of the quarter wavelength. Thus a cavity can be designed to suit the laser wavelength. The most suitable lasers for trimming thin film resistors are presently based on the well known laser activator ion neodymium 3+. Depending on the host lattice into which the neodymium 3+ ion is incorporated or the design of the laser cavity, the main lasing line wavelength can be changed. For example, in the host lattice $Y_3Al_5O_{12}$ (YAG) the lasing wavelength is at 1064 nm, and in the host lattice $YLiF_4$ (YLF) it is at 1047 nm.

It is therefore highly desirable to be able to precisely control the thickness of both the dielectric films 20 and 30 in manufactured wafers such that the total dielectric stack containing the thin film resistor gives the beneficial absorption and reflection properties necessary for efficient laser trimming and without using excessive laser powers that may damage circuit components. However, in an integrated circuit manufacturing environment, where dielectric stacks 20 and 30 may be composed of many different layers containing additive thickness errors, it is difficult to precisely control the thickness of these layers to satisfy these requirements.

SUMMARY OF THE INVENTION

Pursuant to the present invention, a thin film resistor processing flow is disclosed that solves the problem of accurately incorporating the resistor to be trimmed in an optimized multilayer stack. This is achieved by measuring the total thickness of the dielectric stack between the silicon substrate and the top of the dielectric stack just prior to the formation of the thin film resistor. Then, the thickness of the dielectric stack is adjusted to be an odd integer number of laser quarter wavelengths. The thin film resistor is then formed and overlying dielectric is deposited. The thickness of the overlying dielectric may likewise be adjusted to be an odd integer number of laser quarter wavelengths.

An advantage of the invention is providing a method of forming a thin film resistor in a dielectric stack whose thickness is optimized for accurate laser trimming.

This and other advantages will be apparent to those of ordinary skill in the art having reference to the specification in conjunction with the drawings.

DETAILED DESCRIPTION OF THE EMBODIMENTS

The present invention is a laser trimmable thin film resistor of an integrated circuit and a method of manufacturing the same. The invention will be described in conjunction with laser trimming using a 1047 nm laser wavelength of a Nd:YLF laser. It will be apparent to those of ordinary skill in the art that the invention may be applied to laser trimming with other lasers and wavelengths, such as a 1064 nm wavelength of a YAG laser.

Figure 1:
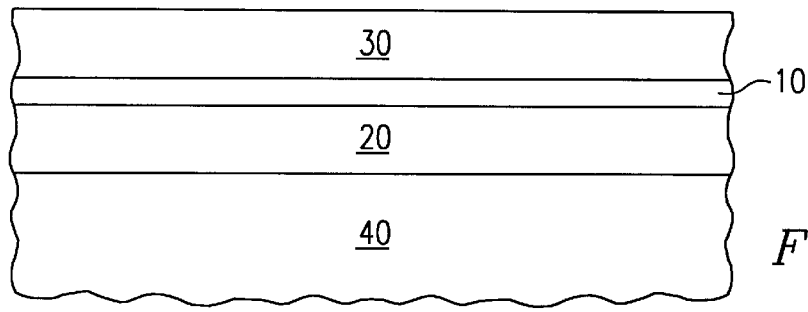
FIG. 1 is a cross-sectional diagram of a thin film resistor according to the prior art.
Figure 2:
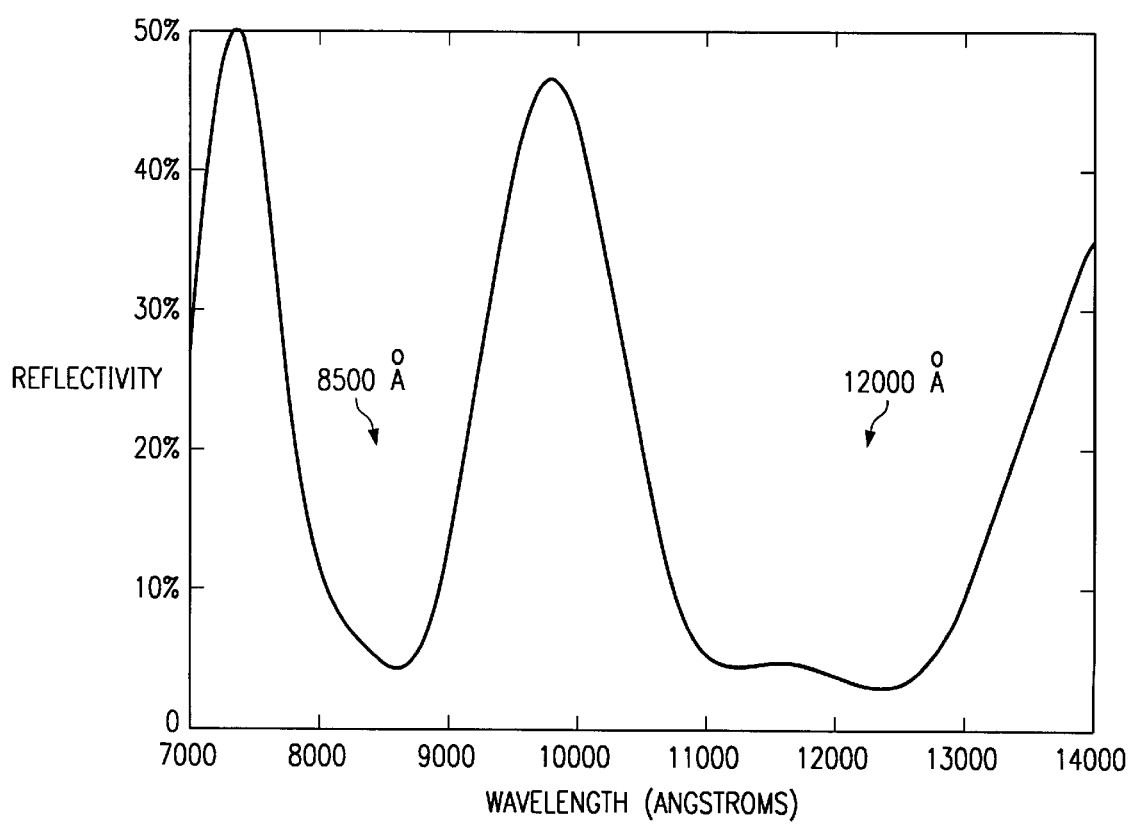
FIG. 2 is a graph of laser wavelength associated with the resistor of FIG. 1.
Figure 3:
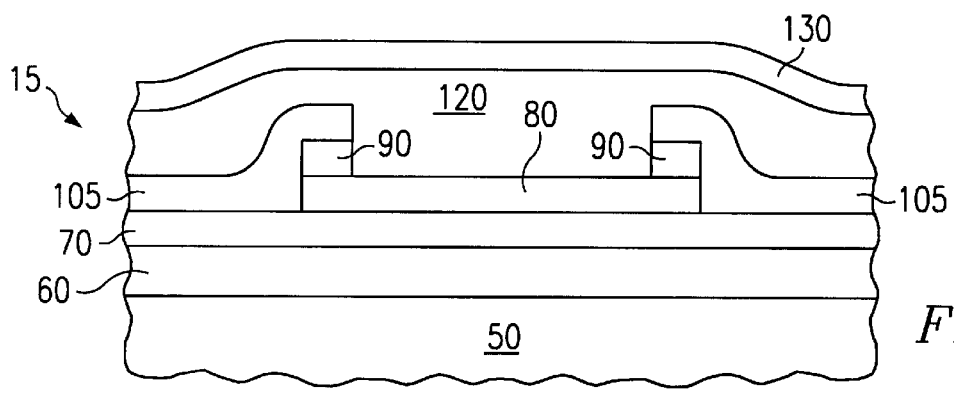
FIG. 3 is a cross-sectional diagram of an integrated circuit having a laser trimmable thin film resistor optimized for laser trimming according to the invention.

A portion of an integrated circuit 15 having a laser trimmable thin film resistor 80 according to the invention is shown in FIG. 3. A semiconductor body 50 has a dielectric layer 60 located thereover. Semiconductor body 50 is typically a silicon substrate with transistors and other devices formed therein. Dielectric layer 60 is typically a series of dielectric layers formed prior to the first metal interconnect layer 105. For example, dielectric layer 60 may include a field oxide and a multi-level dielectric layer. If resistor 80 is formed at a subsequent metal interconnect layer instead of at the first metal interconnect layer as shown in FIG. 3, dielectric layer 60 will also include interlevel dielectric layers formed prior to the resistor 80.

Integrated circuit 15 also includes a first optimization layer 70. First optimization layer 70 is a dielectric layer, preferably silicon dioxide. The thickness of first optimization layer 70 is determined by measuring the thickness of previously formed and planarized dielectric layer 60 and subtracting it from a larger odd integer of quarter wavelengths (i.e., the next larger odd integer or next larger odd integer plus an even number). For example, if the thickness of dielectric layer 60 is 2.5 quarter wavelengths of the 1047 laser, the thickness of optimization layer is 0.5 quarter wavelengths of the 1047 laser to bring the total thickness to 3 quarter wavelengths of the 1047 laser. The closer to the odd quarter wavelength, the easier the resistor is to trim.

An optimization layer 70 is desirable because the total thickness of dielectric layer 60 can not always accurately be controlled. Because dielectric layer 60 consists of a series of dielectric layers, there is typically some discrepancy between the actual thickness and the designed thickness. This discrepancy may be due to errors in the deposition processes and/or in the etchback/planarization processes.

Thin film resistor 80 is located on first optimization layer 70. As shown, resistor 80 is located at the first metal interconnect layer. However, resistor 80 may be located at any of the metal interconnect layers. In fact, resistor 80 may alternatively be formed between metal interconnect layers as discussed in co-pending U.S. patent application Ser. No. 09/452,691 (TI-27935), filed Dec. 02, 1999 to Bailey et al and assigned to Texas Instruments Incorporated. Thin film resistor 80 typically consists of a resistor material 80 such as SiCr, NiCr, or TaN. Portions of a hard mask 90 may remain over the ends of resistor material 80 where electrical connection to metal interconnect layer 105 is desired. Hard mask 90 typically comprises TiW, TiN, or Mo.

Metal interconnect layer 105 is also located over first optimization layer 70. Additional interlevel dielectrics and metal interconnect layers are located over metal interconnect layer 105. Dielectric layer 120 is used to illustrate any interlevel dielectrics formed after resistor 80.

If desired, a second optimization layer 130 may be located over dielectric layer 120. Second optimization layer 130 serves the same function for the dielectric 120 overlying the resistor as first optimization layer 70 serves for the dielectric layer 60 underlying the transistor. It is used to make the total dielectric thickness an odd integer number of quarter wavelengths.

Figure 4:
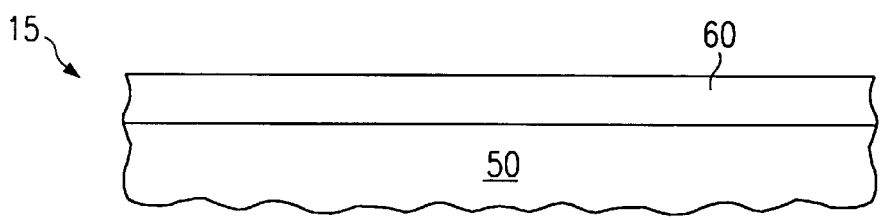
FIGS. 4–10 are cross-sectional diagrams of the integrated circuit of FIG. 1 at various stages of fabrication.
Figure 5:
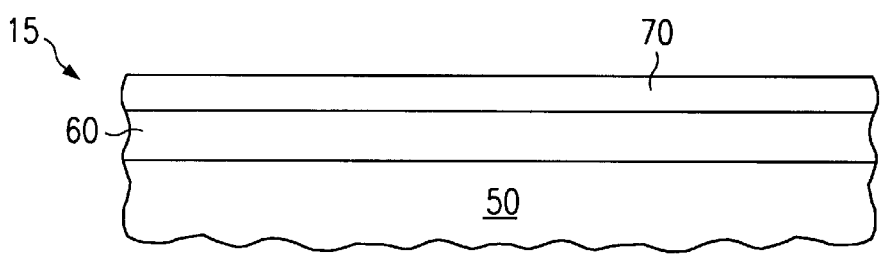

A method for fabricating integrated circuit 15 having a laser trimmable resistor 80 according to the invention will now be described in conjunction with FIGS. 4–10. With reference to FIG. 4, a semiconductor body 50 is provided upon which a series of dielectric layers 60 have been formed. Semiconductor body 50 is typically a silicon substrate having transistors and other devices formed therein. For ease of discussion, any field oxide layer (and/or any other dielectric layer formed on the surface of the silicon substrate) is included as part of dielectric layer 60. Dielectric layer 60 includes layers of material consisting of, but not limited to, well known insulating dielectric layers such as $SiO_2$, BPSG (boron and phosphorous doped silicate glass), SOG (spin on glass), etc. Some of the dielectric layers included in dielectric layer 60 have been deposited and may perform the function of forming insulation layers between metal interconnect layers. Some of the layers of dielectric layer 60 will typically have undergone some sort of planarization step.

The deposition and planarization steps used in forming dielectric layer 60 each have some inaccuracy in them. These inaccuracies tend to compound each other. Accordingly, after dielectric layer 60 is completed the distance between the top of dielectric layer 60 and the silicon substrate of semiconductor body 50 is measured. Then, a first optimization layer 70 is deposited over dielectric layer 60, as shown in FIG. 4. First optimization layer 70 is deposited to a thickness sufficient to bring the total thickness to an odd integer number of quarter wavelengths of the laser that will be used to trim thin film resistor 80. This may be the nearest odd integer number of quarter wavelengths or the nearest plus an even number. For example, if the thickness of dielectric layer 60 is 2.5 quarter wavelengths of the 1047 laser, the thickness of optimization layer is 0.5 quarter wavelengths of the 1047 laser to bring the total thickness to 3 quarter wavelengths of the 1047 laser. First optimization layer 70 comprises a dielectric and is deposited using an accurate deposition method. For example, first optimization layer 70 may comprise silicon dioxide deposited by PECVD (plasma enhanced chemical vapor deposition).

Figure 6:
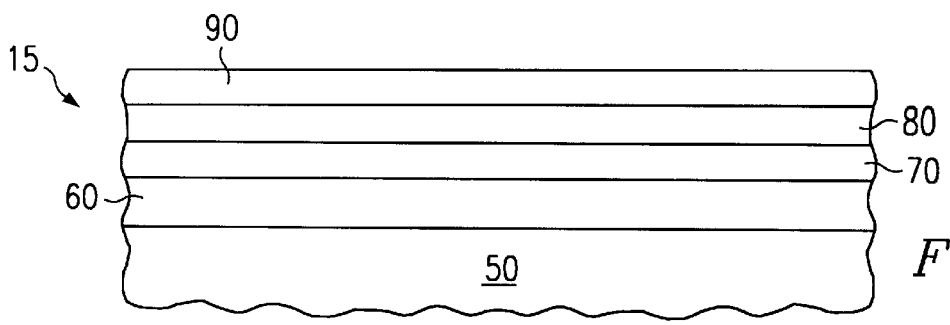

Next, the thin film resistor 80 is formed. There are various methods known in the art for forming thin film resistors. An exemplary method will now be discussed, however, other suitable methods will be apparent to those of ordinary skill in the art. As shown in FIG. 6, a thin film resistor material 80 is deposited over first optimization layer 70. The thin film resistor material can, for example, be sputter deposited and can consist of a material such as, but not limited to, $Si_{72}Cr_{28}$ or $Ni_{40}Cr_{60}$. The thickness of thin film resistor material 80 may be on the order of 100–2000 Å. A hard mask 90 is deposited over thin film resistor material 80 to protect the resistor material 80 from contamination during subsequent processing steps. Hard mask 90 may consist of a material such as TiW, TiN, or Mo. The thickness of hard mask 90 is not critical and may be on the order of 500–3000 Å.

Figure 7:
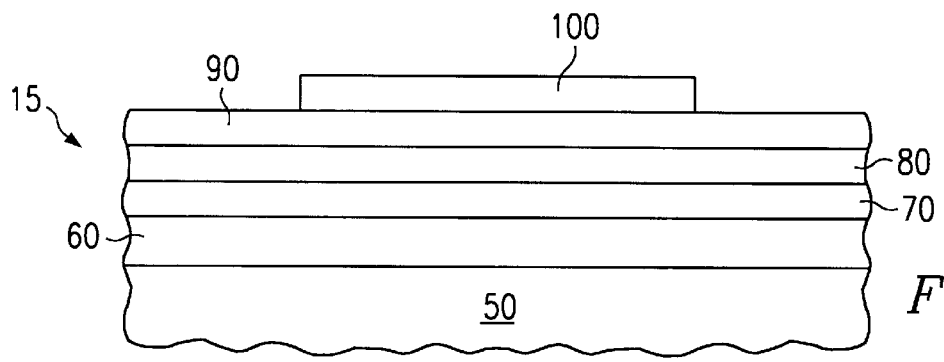

Next, the wafer 15 is delineated with photoresist 100 as shown in FIG. 7. Photoresist 100 masks the portions of hard mask 90 and thin film resistor material 80 where resistors 80 are desired. The exposed portions of hard mask 90 and thin film resistor material 80 that will not constitute the final resistor 80, are removed with a suitable etchant such as $CF_4$ or $SF_6$. After the etch, photoresist mask is stripped.

Figure 8:
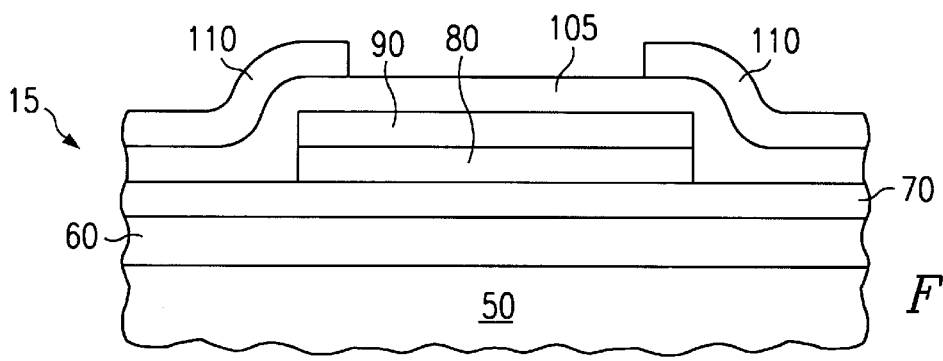
Figure 9:
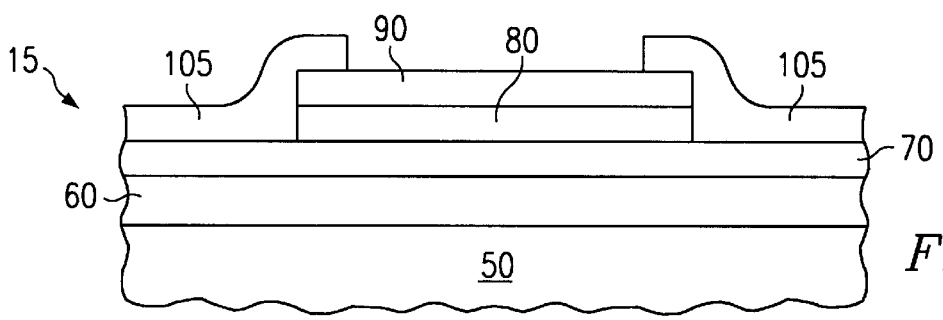

The first metal interconnect layer 105 is formed next. Although shown as metal level 1, the first metal interconnect layer may alternatively be a subsequent metal level. Methods for forming metal interconnect layers, such as layer 105 are well known in the art. For example, a blanket coating of Al 105 may be sputter deposited as shown in FIG. 8. A photoresist mask 110 may then be formed thereover to delineate where metal interconnects are desired. The blanket Al is then etched with a suitable etchant such as 80% $H_3PO_4$, 5% $HNO_3$, 5% $CH_3COOH$ and 10% $H_2O$. Photoresist mask 110 is then stripped. The resulting metal interconnect 105 is shown in FIG. 9.

Figure 10:
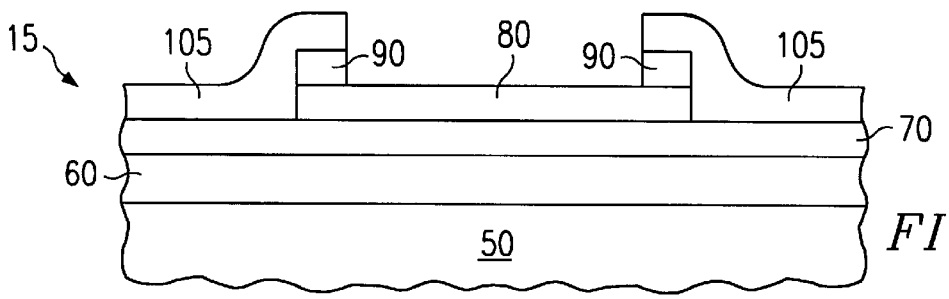

Next, the protective hard mask 90 is etched using the metal interconnect 105 as a mask, as shown in FIG. 10. Suitable etchants that will not contaminate the resistor material 80 are known in the art. For example, $H_2O_2$ may be used to etch a TiW hard mask 90 without damaging the resistor material 80. The thin film resistor 80 now contains electrical contacts which are protected by the remaining portions of hard mask 90 at the metal/resistor interface.

Next, processing continues with the formation of any additional metal interconnect layers and interlevel dielectric layers desired as is known in the art. These remaining dielectric layers (those above resistor 80) are collectively referred to as dielectric layer 120. When all desired metal interconnect and interlevel dielectric layers 120 are completed, the distance from the top of dielectric layer 120 to the thin film resistor 80 may be measured. Then, a final layer 130 of a suitable passivation dielectric is deposited, for example, by PECVD. In the preferred embodiment, the thickness of passivation layer 130 is designed to result in a total upper dielectric thickness (120 and 130) equal to an odd integer number of quarter wavelengths of the laser to be used to trim the resistor 80. The passivation dielectric 130 may consist of a material such as, but not limited to, $SiO_2$, BPSG, SOG, $Si_3N_{4-x}$, where X=0–2.

Figure 11:
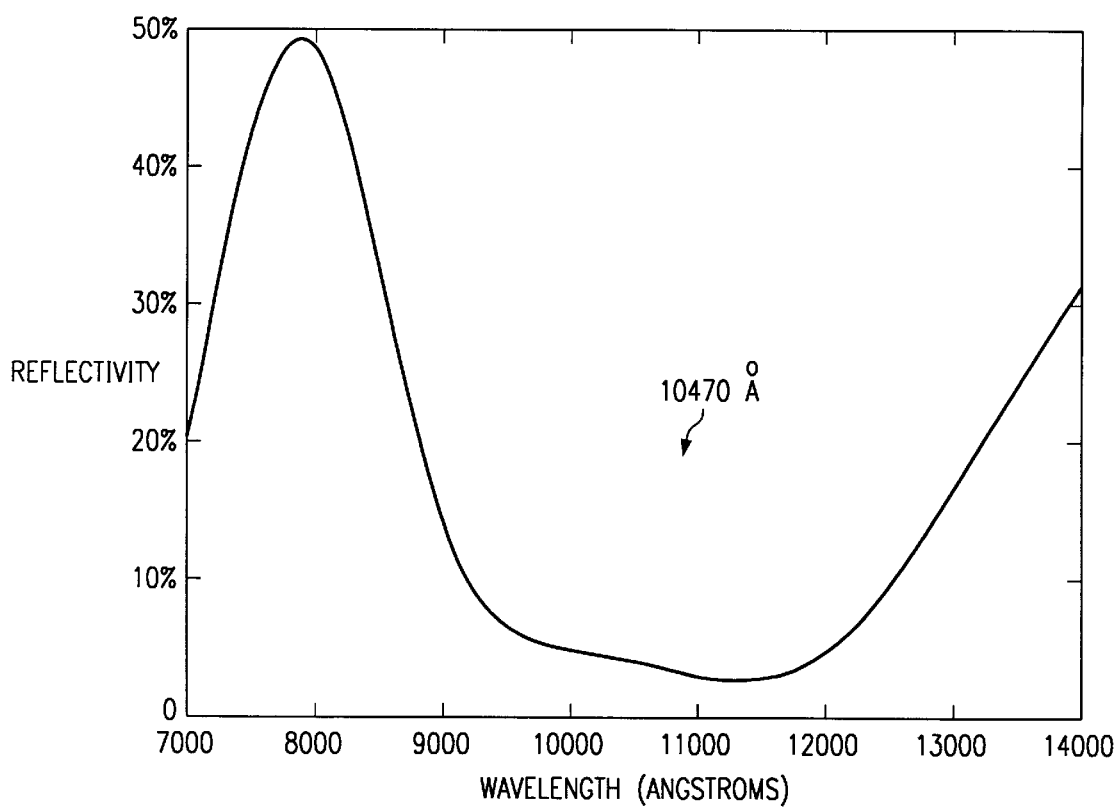
FIG. 11 is a graph of laser wavelength associated with the integrated circuit of FIG. 3.

The reflectivity spectrum of the structure around thin film resistor 80 is shown in FIG. 11. The stack giving the reflectivity spectrum of FIG. 11 consists of the following materials and parameters: a silicon substrate (with refractive index n=3.5, extinction coefficient $k=1.7\times10^{-4}$), upon which a total physical thickness of 5306 Å of silicon dioxide (n=1.48, k=0) is deposited, followed by a 100 Å of NiCr (n=2.63, k=4.28), followed by another 5306 Å of silicon dioxide (n=1.48, K=0). The physical thickness of silicon dioxide multiplied by the refractive index (5306×1.48=7, 853) is thus equal to 3 quarter wavelengths of the 1047 Å laser. It is noted that this structure is precisely tuned to give a minimum reflectivity and therefore maximum absorption in the thin film resistor at the laser wavelength of 1047.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating an integrated circuit, comprising the steps of:
    forming a dielectric stack over a substrate;
    measuring a distance from a top of said dielectric stack to a top of said substrate;
    adjusting the height of said dielectric stack to be an odd integer number of quarter wavelengths of a predetermined laser; and
    forming a resistor over said adjusted dielectric stack.

2. The method of claim 1, further comprising the step of laser trimming said resistor.

3. The method of claim 1, wherein said step of adjusting the height of said dielectric stack comprises the step of depositing a first optimization layer over said dielectric stack, said first optimization layer having a thickness such that said thickness of said first optimization layer plus the thickness of said dielectric stack approximately equals said odd integer number of quarter wavelengths of said predetermined laser.

4. The method of claim 1, further comprising the steps of:
    forming a metal interconnect layer, said metal interconnect layer in electrical contact with said resistor;
    forming an upper dielectric stack over said resistor;
    measuring a height of said upper dielectric stack; and
    adjusting the height of said upper dielectric stack to be an odd integer number of quarter wavelengths of a predetermined laser.

5. The method of claim 4, wherein said adjusting step comprises the step of depositing a second optimization layer over said upper dielectric stack, said second optimization layer having a thickness such that said thickness of said second optimization layer plus the thickness of said upper dielectric stack approximately equals an odd integer number of quarter wavelengths of said predetermined laser.

6. A method of fabricating an integrated circuit, comprising the steps of:

forming a dielectric stack of a semiconductor substrate;

after forming the dielectric stack, measuring a distance from a top of said dielectric stack to a top of said semiconductor substrate;

after said measuring step, adjusting the height of said dielectric stack to be an odd integer number of quarter wavelengths of a predetermined laser; and then, forming a resistor over said adjusted dielectric stack.

* * * * *